(12) United States Patent
Enders et al.

(10) Patent No.: US 8,492,844 B2
(45) Date of Patent: Jul. 23, 2013

(54) FULLY DEPLETED SOI DEVICE WITH BURIED DOPED LAYER

(75) Inventors: Gerhard Enders, Olching (DE); Wolfgang Hoenlein, Unterhaching (DE); Franz Hofmann, Munich (DE); Carlos Mazure, Bernin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/305,206

(22) Filed: Nov. 28, 2011

(65) Prior Publication Data

US 2012/0181609 A1    Jul. 19, 2012

(30) Foreign Application Priority Data

Jan. 13, 2011 (EP) .................................. 11290010

(51) Int. Cl.
*H01L 27/088* (2006.01)
*H01L 29/36* (2006.01)
*H01L 21/8238* (2006.01)

(52) U.S. Cl.
USPC ............... 257/351; 257/607; 257/E27.067; 257/E29.109; 257/E21.632; 438/154

(58) Field of Classification Search
USPC ............... 257/351, 607, E27.067, E21.632, 257/E29.109; 438/154
See application file for complete search history.

(56) References Cited

U.S. PATENT DOCUMENTS

| | | | |
|---|---|---|---|
| 6,835,981 B2 | 12/2004 | Yamada et al. | |
| 7,018,904 B2 | 3/2006 | Yamada et al. | |
| 2003/0057487 A1 | 3/2003 | Yamada et al. | |
| 2004/0195626 A1 | 10/2004 | Yamada et al. | 257/347 |
| 2005/0019999 A1 | 1/2005 | Yamada et al. | |
| 2006/0175659 A1 | 8/2006 | Sleight | 257/347 |
| 2006/0216894 A1 | 9/2006 | Parekh et al. | 438/270 |
| 2007/0228377 A1 | 10/2007 | Wieczorek et al. | 257/67 |
| 2010/0207236 A1 | 8/2010 | Hebras | 257/506 |

FOREIGN PATENT DOCUMENTS

KR    100547059 B1    1/2006

OTHER PUBLICATIONS

European Search Report, EP 1129 0010, dated May 25, 2011.
Takashi Ishigaki et al., XP-001518610, "Wide-Range Threshold Voltage Controllable Silicon on Thin Buried Oxide Integrated with Bulk Complementary Metal Oxide Semiconductor Featuring Fully Silicided NiSi Gate Electrode", Japanese Journal of Applied Physics, vol. 47, No. 4, pp. 2585-2588 (2008).

*Primary Examiner* — Victor A Mandala
*Assistant Examiner* — Whitney T Moore
(74) *Attorney, Agent, or Firm* — Winston & Strawn LLP

(57) ABSTRACT

The present invention relates to a method for the manufacture of a semiconductor device by providing a first substrate; providing a doped layer in a surface region of the first substrate; providing a buried oxide layer on the doped layer; providing a semiconductor layer on the buried oxide layer to obtain a semiconductor-on-insulator (SeOI) wafer; removing the buried oxide layer and the semiconductor layer from a first region of the SeOI wafer while maintaining the buried oxide layer and the semiconductor layer in a second region of the SeOI water; providing an upper transistor in the second region by forming a back gate in or by the doped layer; and providing a lower transistor in the first region by forming source and drain regions in or by the doped layer.

23 Claims, 6 Drawing Sheets

FULLY DEPLETED SOI DEVICE WITH BURIED DOPED LAYER

FIELD OF INVENTION

The present invention relates to fully depleted Silicon-On-Insulator (SOI) devices, and in particular, fully depleted double-gate SOI transistors and Dynamic random-access memory (DRAM) devices.

BACKGROUND OF THE INVENTION

Semiconductor-On-Insulator (SeOI) and, in particular, SOI semiconductor devices, are of increasing interest in present and future semiconductor manufacturing, for example, in the context of the Complementary Metal Oxide Semiconductor (CMOS) technology.

A Metal Oxide Semiconductor (MOS) transistor, irrespective of whether an n-channel transistor or a p-channel transistor is considered, comprises so-called pn-junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer.

Recently, multiple-gate, in particular, double-gate transistors have been introduced in the art. As compared to transistors with a single gate, double-gate transistors exhibit a higher on-current, a lower off-current, a better sub threshold swing and a lower variation of the threshold voltage due to a relatively lightly doped channel region. Double-gate transistors are preferably realized in fully depleted SOI structures with thin buried oxides and highly doped back plane (layer). Double-gate transistors are part of core circuits and periphery circuits of DRAM devices.

In the art, however, the manufacturing process of fully depleted double-gate SOI transistors with highly doped back plane is complicated and may cause damage within the SOI region due to a high dose implant used to form the back plane. Conventionally, the doped back plane is formed by implantation through both the SOI layer and the buried oxide layer. The contamination with dopants in the active layer caused by the back plane implantation, however, results in an increased variation of the threshold voltage. The higher the doping rate that is selected, the higher the resulting variation of the threshold voltage. Moreover, since a relatively high doping energy is necessary in the art in order to form the back gate, deeply extending doping regions result. This badly affects miniaturization of the devices. Thus, improvements in this technology are necessary.

SUMMARY OF THE INVENTION

In view of this, the present invention now provides a method for the manufacture of a fully depleted SOI device that is less complicated and avoids the above-mentioned problems as well as to provide a device that can be obtained by such a method. The present invention thus provides a SeOI wafer suitable for the manufacture of a fully depleted SeOI device and also provides a device wherein the above-mentioned drawbacks can be avoided.

In particular, the present invention relates to a method for the manufacture of a semiconductor device by providing a first substrate; providing a doped layer in a surface region of the first substrate; providing a buried oxide layer on the doped layer; providing a semiconductor layer on the buried oxide layer to obtain a semiconductor-on-insulator (SeOI) wafer; removing the buried oxide layer and the semiconductor layer from a first region of the SeOI wafer while maintaining the buried oxide layer and the semiconductor layer in a second region of the SeOI wafer; forming an upper transistor in the second region forming a back gate in or by the doped layer; and forming a lower transistor in the first region by forming source and drain regions in or by the doped layer. The doped, buried oxide and/or semiconductor layer are typically provided by being arranged upon or formed on or in a subjacent layer.

According to the inventive method, there is no need for doping of the source/drain regions of the transistor in the first region through a semiconductor layer and/or buried oxide layer. In particular, the extension of the source/drain regions of the transistor in the first region can be accurately determined by the thickness of the doped layer. Moreover, parts of the same doped or buried layer can be used for both the formation of a back gate of one or more transistors in the second region and the source/drain regions of a transistor in the first region, thereby simplifying the overall manufacturing process. The first region may represent a memory cell area of a DRAM device and the second region may represent a core region or a region of periphery circuits of the DRAM device.

The method may further comprise providing a second substrate, providing e.g., by forming, the semiconductor layer on or as part of the second substrate; forming the buried oxide layer by providing an oxide layer either on the semiconductor layer, on the doped layer of the first substrate, or on both layers; bonding the first and the second substrates to provide the buried oxide layer in-between the semiconductor layer and the eloped layer; and removing the second substrate. Preferably, the second substrate has a zone of weakness that defines the semiconductor layer, and the semiconductor layer is transferred to the first substrate by detaching at the zone of weakness. Thus, the SeOI wafer can be obtained by wafer transfer techniques. The wafer transfer is facilitated by the oxide layer. The buried oxide layer of the resulting SeOI wafer can be formed by a combination of an oxide layer formed on the semiconductor layer formed on the second substrate and an oxide layer formed on the first substrate wherein the combination results from tire bonding process. Alternatively, bonding is facilitated by an oxide layer formed exclusively on the semiconductor layer or exclusively on the substrate. The wafer transfer may, for example, be performed according to the SmartCut© layer transfer technique.

In the above described embodiments, the forming of the doped layer may comprise doping the surface region of the first substrate by the implantation of a suitable dopant. In this context, it should be noted that the doping can be performed through the semiconductor layer or through the buried oxide layer or through the semiconductor layer and the buried oxide layer, for example. Alternatively, the forming of the doped layer may comprise forming, in particular, epitaxially growing, the doped layer on the surface of the first substrate. For example, a mono crystal silicon layer provided with dopants during or after the growth process may be grown as the doped layer on a polysilicon first substrate.

In the above described embodiments, the semiconductor layer may be a silicon layer, and in particular, is a monocrystal silicon layer. The silicon layer may be epitaxially grown on the doped layer formed on first substrate. It might be preferable for a seed layer to first be provided on the first substrate and upon which the silicon layer is epitaxially grown. According to an embodiment, the doping of the doped layer is an n (p) doped layer, in particular, an n⁺ (p+) doped layer as far as the concentration concerns. The dopant, may be a refractory metal chosen from the group consisting of Co, Ni, Ti, Mo, W or Ta.

In the above-described embodiments, the removing of the buried oxide layer and the semiconductor layer from the first region of the SeOI wafer can comprise providing a mask layer on the first and second regions; providing a photoresist on the mask layer in the second region and exposing the first region; removing the mask layer and the semiconductor layer in the first region based on the patterned photoresist; removing the photoresist layer; removing the mask layer in the second region; removing the oxide layer in the second region; and removing the buried oxide layer in the first region. The buried oxide layer is removed in the first region after removal of the mask layer in the second region. Also, an oxide layer may be provided on the semiconductor layer in the first and second regions before providing the mask layer thereon and, if so provided, is removed from the first region with the mask layer.

This particular sequence of manufacturing steps results in a reliable damage-free removal of the buried oxide layer and the semiconductor layer in the first region in an efficient manner in terms of the process flow. The manufacture of the semiconductor device may further comprise forming or otherwise providing a trench in the second region to separate a region where a p-channel transistor is present from a region where an n-channel transistor is present; forming or otherwise providing a trench separating the first from the second region; forming or otherwise providing a p-well and an n-well region of the first region; and forming or otherwise providing a recessed channel array transistor trench in the first region such that it extends into the p-well region formed below the doped layer in the first region.

The trench in the second region may be completely filled by an isolator material (e.g., an oxide) in order to form a shallow trench isolator or may be filled up to the level of the buried oxide layer thereby providing a mesa isolation.

The p-well and n-well region in the first region are formed by implantation. Here, no implantation through a buried oxide and semiconductor layer of an SOI wafer is necessary. The threshold voltage of a memory cell array to be formed in the first region according to an embodiment of the present invention can readily be adjusted by a further implantation of a dopant through the recess channel array transistor (RCAT) trench. Thus, according to the herein disclosed method the formation of an RCAT in the first region can be integrated in the manufacture of p-/n-channel transistors for the core and periphery circuits of a DRAM in a very efficient and damage-avoiding manner.

Furthermore, in the above-described embodiments, source and drain regions of the transistor in the first region are formed or provided without further implanting dopants in the doped layer. In this case, the necessary doping rate is already provided by the doped layer when forming or providing the same on the substrate before completing the SeOI wafer. Thereby, no additional deposition and removal of a dopant mask layer is needed and no damage is caused by source and drain formation. Alternatively, the providing or forming the source and drain regions of the transistor in the first region may comprise implanting dopants in the doped layer to adjust the doping profile when necessary.

According to an embodiment, an additional doped silicon layer is formed, in particular, by epitaxial growth, on the semiconductor layer, in particular, the silicon layer, adjacent to gate structures of the transistors that are present in the first and second regions in order to form raised (partly above the level of the gate dielectric) source and drain regions if desired.

Thus, the resulting raised source and drain regions in this case comprise the additional doped silicon layer and the semiconductor layer in the second region and the additional doped silicon layer and the doped layer in the second region, respectively.

The invention also relates to an SeOI wafer, in particular, an SOI wafer, comprising a substrate having a doped surface layer; a buried oxide layer arranged only on a part of the doped layer; and a semiconductor layer arranged on the buried oxide layer arranged on the part of the doped layer to obtain the SeOI wafer. In SeOI wafer, the substrate and the semiconductor layer may consist of or comprise silicon and the doped layer may comprise a refractory metal such as Co, Ni, Ti, Mo, W or Ta as a dopant. Typically, the SeOI wafer includes a plurality of regions of buried oxide and semiconductor layers arranged only parts of the doped layer and a plurality of regions wherein doped surface layer is exposed.

Such a wafer is ideally suitable for forming a DRAM device comprising p-channel and/or n-channel transistors in the region where the semiconductor layer and the buried oxide layer are present and where a recessed channel array transistor for a memory cell array is present in the region of the wafer where no semiconductor layer and buried oxide layer are provided such that the (buried) doped layer may provide the back gate for the p-channel and/or n-channel transistors and at least partly the source and drain regions for the recessed channel array transistor.

BRIEF DESCRIPTION OF THE DRAWINGS

Additional features and advantages of the present invention will be described with reference to the drawings. In the following detailed description, reference is made to the accompanying figures that are meant to illustrate preferred embodiments of the invention. It is understood, however, that such embodiments represent preferred features of the invention. In these drawings.

DETAILED DESCRIPTION OF THE INVENTION

In the following description, preferred embodiments of the present invention are illustrated by way of SOI structures. Of course, a skilled artisan would realize that the manufacturing methods and resultant structure and devices can incorporate semiconductor materials other than silicon to form SeOI structures as previously discussed. This would include other Group IV or Group III-V materials. Similarly, references to silicon dioxide are included as preferred examples of the oxides or other insulating materials that can be used in this invention.

Figure 1:
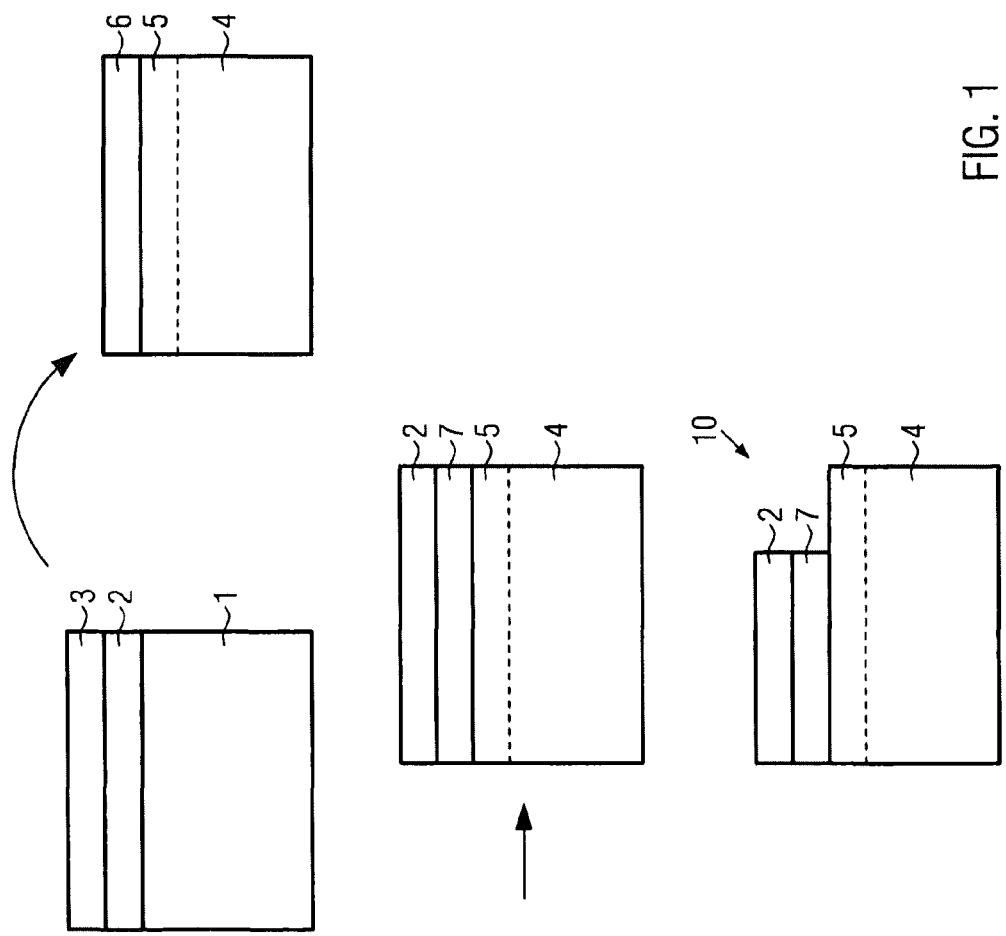
FIG. 1 illustrates an example for the method for manufacturing a semiconductor device according to the present invention, wherein an SOI structure comprising a buried doped layer is formed.

A preferred process for the manufacture of an SOI structure comprising a buried doped layer is shown in FIG. 1. It begins with a donor silicon substrate 1. Next, a silicon layer 2 is grown on the donor silicon substrate 1. Optionally, a seed layer (not shown) may be formed on the donor silicon substrate 1 to facilitate or otherwise assist in the growth of the silicon layer 2 thereon. Subsequently, a silicon dioxide layer 3 is formed on the silicon layer 2.

On the other hand, a silicon substrate 4 is provided for the SOI structure to be obtained. A doped layer 5 is formed in the region of or on the upper surface of the silicon substrate 4. According to an example, n+ doping of the upper portion of the silicon substrate 4 is performed thereby resulting in the doped layer 5. According to an alternative example, a doped silicon layer 5, in particular, an n+ doped silicon layer, is epitaxially grown on the silicon substrate 4. Then, a silicon dioxide layer 6 is formed on the doped layer 5. If desired a zone of weakness can be provided in the substrate 1 so that the silicon 2 and silicon dioxide 3 layers can be transferred to substrate 4 by conventional layer transfer techniques, Typically, this zone of weakness is provided between substrate 1 and layer 2 and is obtained by implantation of atomic species or by providing a porous layer. During a layer transfer process the oxide layer 3 formed on the silicon layer 2 and the oxide layer 6 formed on the doped layer 5 are bonded to each other and the donor substrate 1 is removed, such as by detachment at the zone of weakness. The resulting structure comprises substrate 4, the buried doped layer 5, the buried oxide layer 7 resulting from the combination of the oxide layers 3 and 6 dining bonding, and the silicon layer 2.

Subsequently, the silicon layer 2 and the buried oxide layer 7 are removed on a first region while maintaining them on a second region thereby resulting in then SOI wafer 10. As shown in the figures, the first region may be any portion but not all of the exposed surface of the wafer, while the second region can be any desired configuration that is adjacent the first portion. While FIG. 1 shows these regions in a simplified way, the skilled artisan would immediately recognize that these regions can be provided in any desired size, shape or orientation as desired to achieve the benefits of the present manufacturing process and resulting structures.

The removal of the second region may be performed as follows. A pad oxide is optionally but preferably grown on the silicon layer 2 and a hard mask layer, for example, a nitride layer is formed on the pad oxide. Then, a photoresist is formed on the hard mask layer and patterned to expose the hard mask layer in the first region. Then, the hard mask, the underlying pad oxide and the silicon layer 2 are etched in the first region. Subsequently, the photoresist is stripped and the nitride is removed and all of the exposed oxide including the buried oxide layer 7 in the first region is removed. The thus obtained SOI wafer 10 shown in FIG. 1 is suitable for the manufacture of a fully depleted multi-(or double) gate SOI FET as well as DRAM devices.

Figure 2A:
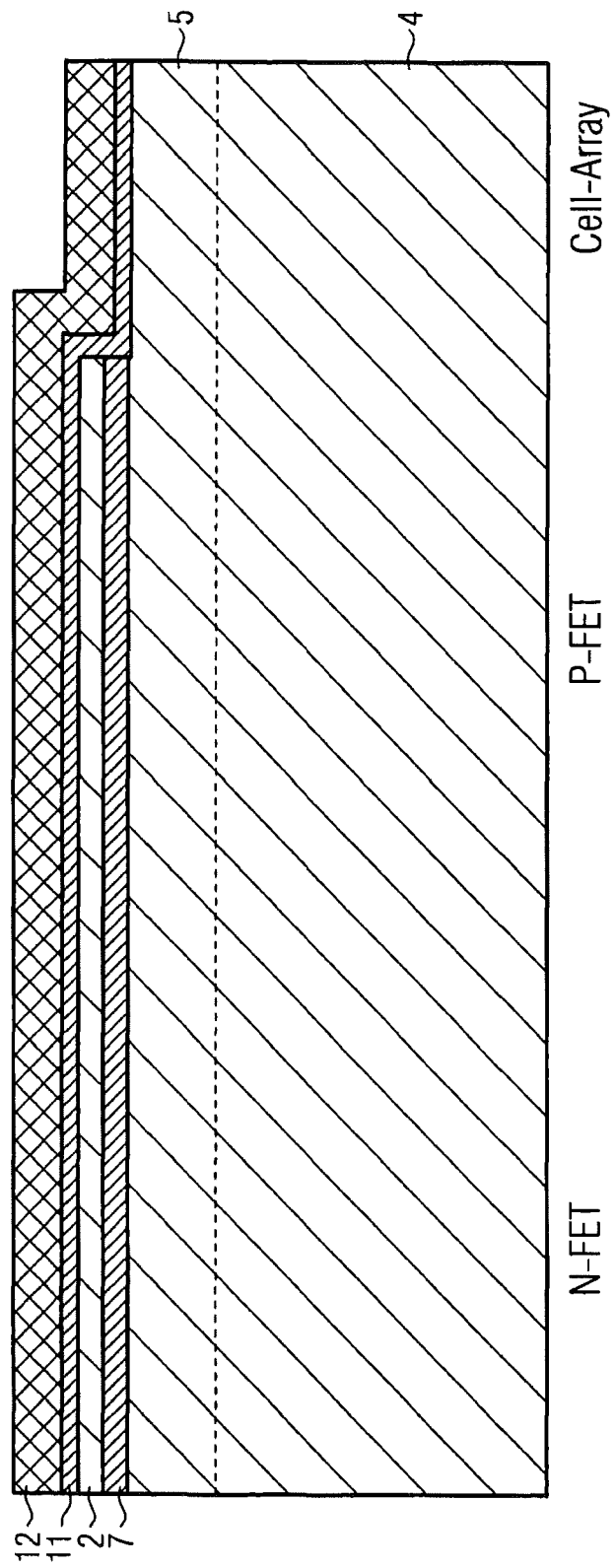
FIGS. 2a-2e illustrate the manufacture of a DRAM device according to an example of the present invention based on the SOI wafer illustrated in FIG. 1.

In the following, the manufacture of a DRAM device according to an example of the present invention is described with reference to FIGS. 2a-2e. The starting point is given by the SOI wafer 10 shown in FIG. 1. A pad oxide 11 and a hard mask layer 12, for example, a nitride layer, are then formed on the exposed portion of the doped layer 5 in the first region as well as the silicon layer in the second region. The resulting structure is illustrated in FIG. 2a. Three active regions are indicated, one region where an n-channel FET will be formed, one region where a p-channel FET will be formed and one region where a memory cell array will be formed. The regions of the n-channel FET and p-channel FET comprise the silicon layer 2 and buried oxide layer 7 as well as pad oxide 11 and pad nitride 12. The memory cell array comprises pad oxide 11 and pad nitride 12 but is free off the silicon layer 2 and the buried oxide layer 7.

Figure 2B:
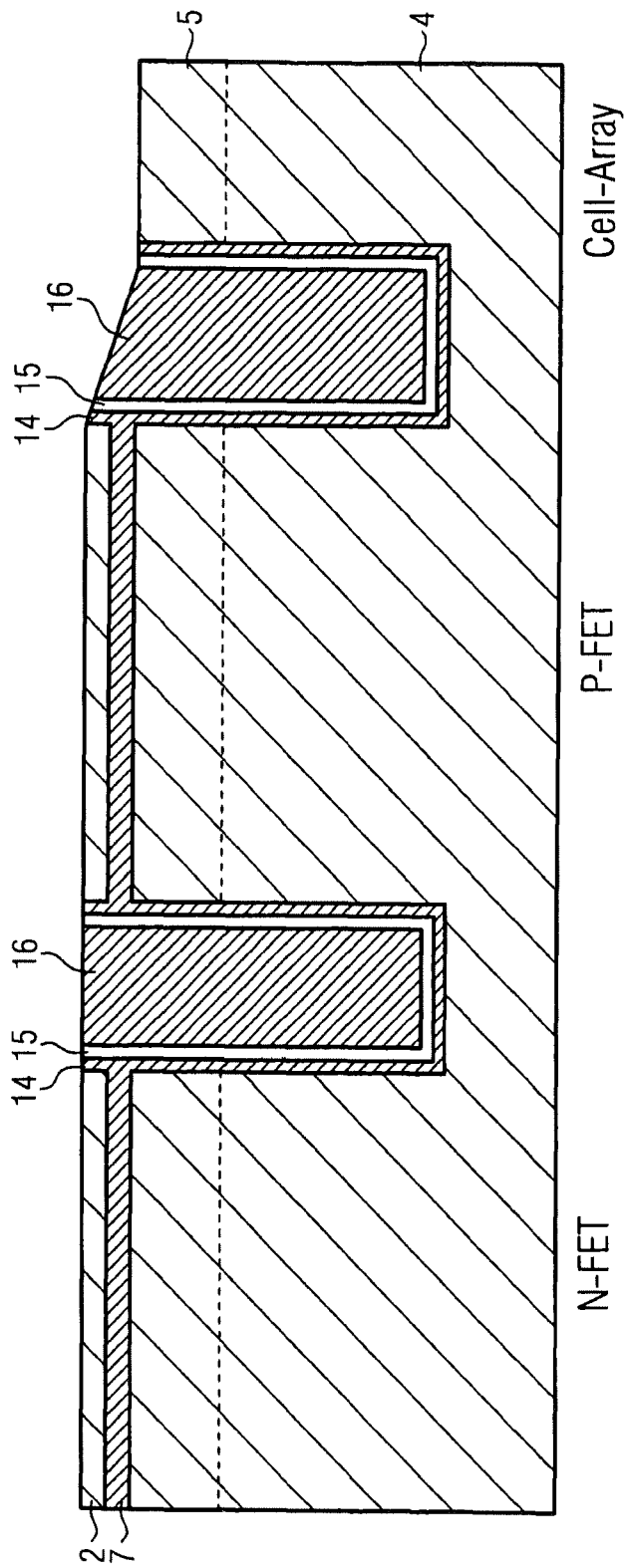

By photolithographic processing, trenches separating the three different active regions are subsequently formed. In some detail, a patterned photoresist is formed on the pad nitride to etch the same in the trench regions. After removal of the photoresist, the silicon is etched to form the trenches. Next a trench oxide liner and a trench nitride liner are subsequently formed in the trenches and, then, the trenches axe filled with oxide material. After annealing and chemical-mechanical polishing as well as etching of the nitride and oxide, the structure illustrated in FIG. 2b is obtained. Trenches 13 separate the active region of the n-channel FET from the active region of the p-channel FET and the active region of the p-channel FET from the active region of the memory cell array, respectively. The trenches 13 are filled with the above-mentioned trench oxide liner 14 and trench nitride liner 15 as well as a trench filling oxide 16. Note, that the trench separating the active region of the n-channel FET from the active region of the p-channel FET may be completely filled to provide a shallow trench isolation or may be filled only from the top down to the bottom of the buried oxide layer 7 in order to provided a mesa isolation.

Figure 2C:
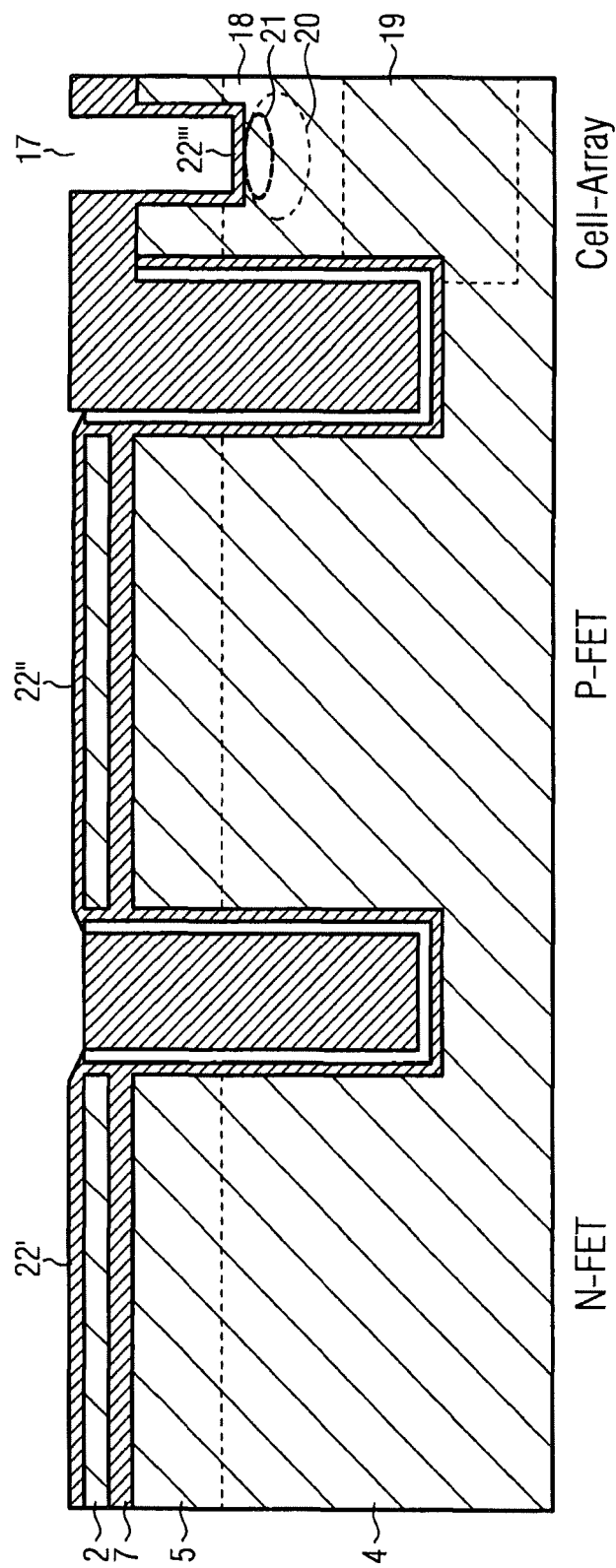

Next, a screening oxide may be formed over the entire structure shown in FIG. 2b and in the region of the memory cell array a lower n-well region and an upper p-well region are formed by Implantation. In the region of the memory cell array, a recessed channel array transistor (RCAT) has to be formed. After steps of planarization including the deposition of a planarization oxide and chemical mechanical planarization of the same a nitride hard mask and an appropriately patterned photoresist are formed for etching an RCAT trench in the region of the memory cell array. In the etched RCAT trench an oxide is formed. Implantation of species for adjusting the threshold voltage and the gate oxide is performed through the RCAT trench and in the p-well region. Gate oxides of different thicknesses are formed in the RCAT trench and the regions of the n-channel FET and p-channel FET. The resulting structure is illustrated in FIG. 2c. As can be seen the RCAT trench 17 is formed partially extending into the p-well region 18 formed above the n-well region 19. Within the p-well region 18 an implant region 20 for adjusting the threshold voltage and an implant region 21 for adjusting the gate oxide are formed. A relatively thick gate oxide 22' is formed in the region of the n-channel FET and a relatively thin gate oxide 22" is formed in the region of the p-channel FET, Alternatively, both gate oxides 22' and 22" may be formed relatively thin or thick or the gate oxide 22" may be formed thicker than the gate oxide 22'. Another gate oxide 22''' is formed in the RCAT trench 17. Gate oxide nitration and gate oxide anneal can be performed, if desired.

Figure 2D:
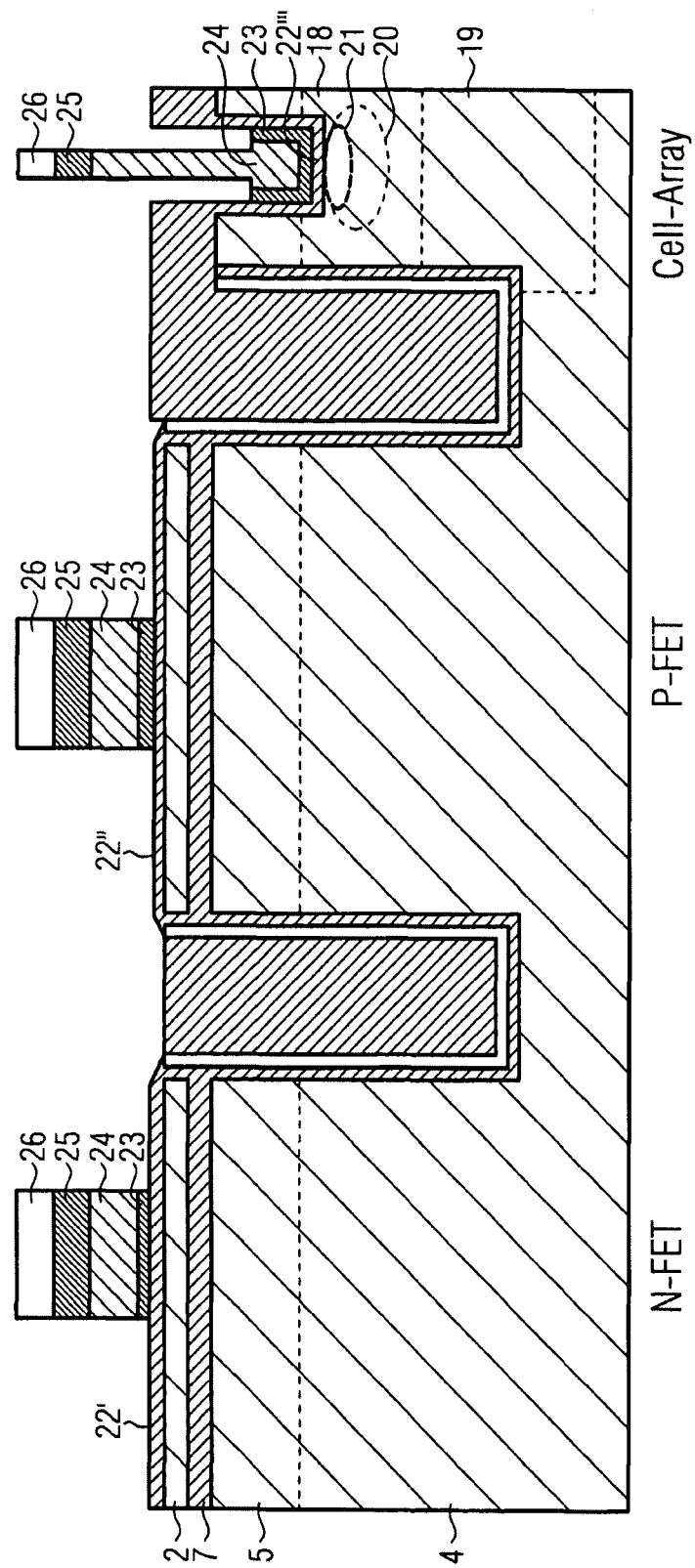

Gate electrode structures in the regions of the n-channel FET and p-channel FET as well as in the region of the memory cell array are formed as shown in FIG. 2d. In the shown example the gate structures comprise a layer 23 made of TiN, a layer 24 made of polysilicon, a W barrier layer 25 and a nitride layer 26. The shown gate structures result from deposition of the respective layers and photolithography processing as known in the art. A nitride layer is deposited over the structure shown in FIG. 2d and lightly doped drain regions are implanted in the regions of the n-channel FET and p-channel FET adjacent to the respective gate structures. A sidewall spacer oxide is formed above the nitride layer above the gate structures in the regions of the n-channel FET and p-channel FET and after etching in order to obtain oxide sidewall spacers and another nitride layer is deposited and etched to form nitride sidewall spacers above both the gate structures in the regions of the n-channel FET and p-channel FET and the gate structure in the region of the memory cell array.

Oxide on the surface of the buried doped region 5 in the region of the memory cell array and oxide on the silicon layer 2 in the regions of the n-channel FET and p-channel FET are etched back. Silicon is formed on the thus exposed surfaces by selective epitaxial growth and dopants are implanted in the epitaxially grown silicon as well as the underneath silicon layer 2 in the regions of the n-channel FET and p-channel FET and optionally the underneath buried implant layer 5 in the region of the memory cell array, respectively. It may be preferable, however, to adjust the doped concentration in the doped layer 5 such that no significant doping by implantation through the epi silicon is needed for the RCAT.

Figure 2E:
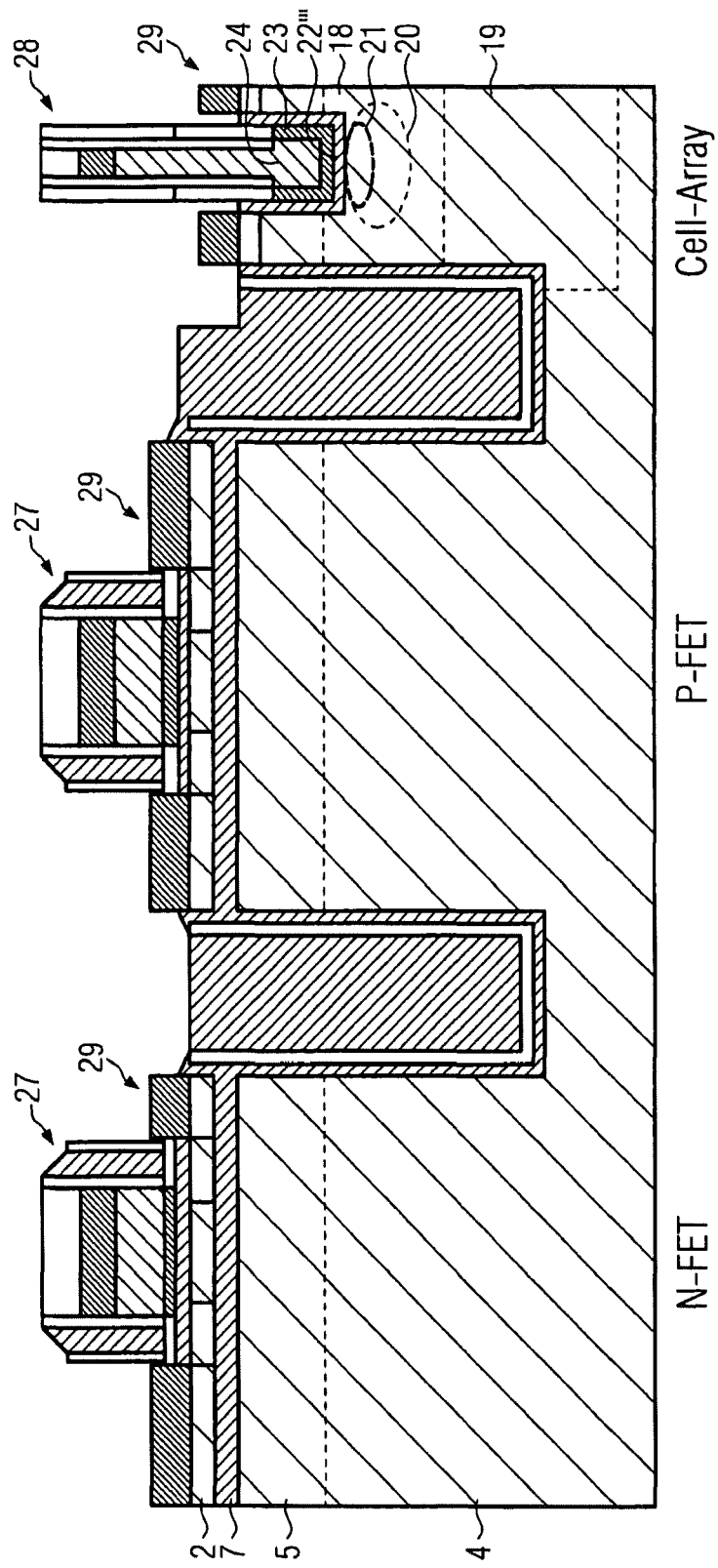

The resulting structure is illustrated in FIG. 2e. As shown in this figure, the gate structures in regions of the n-channel FET and p-channel FET comprise sidewall spacers 27 comprising oxide and nitride. The gate structure in the region of the memory cell array comprises a sidewall spacer 28 made of nitride. Adjacent to all of the gate structures epi silicon 29 is formed and doped in order to form source/drain regions. The eloping of the epi structures can be performed by implantation after growth or during the growth of the same.

As becomes apparent from the description of FIGS. 2a to 2e according to a preferred embodiment of the present invention, a buried thin highly doped n-layer 5 is formed in an SOI wafer that, on the one hand, can be used as a back gate layer in the core and periphery circuits of a DRAM device and, on the other hand, can be used for highly doped source and drain regions of an RCAT in the memory cell area. Whereas the provision of a if back plane in a p-doped substrate has been described it is readily understood that a p doped layer providing a p+ back plane in an n-doped substrate is also covered by the present invention.

All previously discussed embodiments are not intended as limitations but serve as examples illustrating features and advantages of the invention. It is to be understood that some or all of the above described features can also be combined in different ways.

What is claimed is:

1. A method for the manufacture of a semiconductor device, which comprises:
    providing a first substrate;
    providing a doped layer in a surface region of the first substrate;
    providing a buried oxide layer on the doped layer;
    providing a semiconductor layer on the buried oxide layer to obtain a semiconductor-on-insulator (SeOI) wafer;
    removing the buried oxide layer and the semiconductor layer from a first region of the SeOI wafer while maintaining the buried oxide layer and the semiconductor layer in a second region of the SeOI wafer, wherein the buried oxide layer and the semiconductor layer in the second region are arranged only on parts of the doped layer;
    providing an upper transistor in the second region by forming a back gate in or by the doped layer; and
    providing a lower transistor in the first region by forming source and drain regions in or by the doped layer.

2. The method according to claim 1, wherein the lower transistor is a recessed channel array transistor.

3. The method according to claim 1, wherein the first region represents a memory cell area of a dynamic random-access memory (DRAM) device and the second region represents a core region or a region of periphery circuits of the DRAM device.

4. The method according to claim 1, wherein the SeOI wafer is provided by
    forming the semiconductor layer on or as part of a second substrate;
    forming the buried oxide layer by providing an oxide layer either on the semiconductor layer, on the doped layer of the first substrate, or on both layers;
    bonding the first and the second substrates to provide the buried oxide layer in-between the semiconductor layer and the doped layer; and
    removing the second substrate.

5. The method according to claim 1, wherein the providing of the doped layer comprises doping the surface region of the first substrate.

6. The method according to claim 1, wherein the providing of the doped layer comprises forming or epitaxially growing the doped layer on the surface of the first substrate.

7. The method according to claim 1, wherein one of the semiconductor layer or the first substrate or both includes or is silicon.

8. The method according to claim 1, wherein the doped layer includes an n or n+ dopant or a p or p+ dopant.

9. The method according to claim 1, wherein the removing of the buried oxide layer and the semiconductor layer from the first region of the SeOI wafer comprises:
    providing a mask layer on the first and second regions;
    providing a photoresist on the mask layer in the second region and exposing the first region;
    removing the mask layer and the semiconductor layer in the first region;
    removing the photoresist layer;
    removing the mask layer in the second region; and
    removing the buried oxide layer in the first region;
    wherein the buried oxide layer is removed in the first region after removal of the mask layer in the second region.

10. The method according to claim 9 which further comprises providing an oxide layer on the first and second regions before providing the mask layer, with the oxide layer later being removed with the mask layer and the semiconductor layer in the first region.

11. The method according to claim 9, which further comprises:
    providing a trench in the second region to separate a region where a p-channel transistor is present from a region where an n-channel transistor is present;
    providing a trench separating the first from the second region;
    providing a p-well and an n-well region of the first region; and
    providing a recessed channel array transistor trench in the first region such that it extends into the p-well region that is present below the doped layer in the first region.

12. The method according claim 1, wherein the providing of the source and drain regions of the transistor in the first region is performed without further implanting dopants in the doped layer.

13. The method according to claim 1, wherein the providing of the source and drain regions of the transistor in the first region comprises implanting dopants in the doped layer to adjust the doping profile.

14. The method according to claim 1, which further comprises provided a doped silicon layer on the silicon layer adjacent to gate structures of the transistors present in the first and second regions in order to form source and drain regions.

15. The method according to claim 14, wherein the doped silicon layer on the silicon layer if provided by epitaxial growth of the doped silicon layer.

16. A method for the manufacture of a semiconductor device, which comprises:
    providing a first substrate;
    providing a doped layer in a surface region of the first substrate;

providing a second substrate;
forming the semiconductor layer on or as part of a second substrate;
forming the buried oxide layer by providing an oxide layer either on the semiconductor layer, on the doped layer of the first substrate, or on both layers;
bonding the first and the second substrates to provide the buried oxide layer in-between the semiconductor layer and the doped layer; and removing the second substrate, wherein the second substrate has a zone of weakness that defines the semiconductor layer, and the semiconductor layer is transferred to the first substrate by detaching at the zone of weakness;
removing the buried oxide layer and the semiconductor layer from a first region of the SeOI wafer while maintaining the buried oxide layer and the semiconductor layer in a second region of the SeOI wafer;
providing an upper transistor in the second region by forming a back gate in or by the doped layer; and
providing a lower transistor in the first region by forming source and drain regions in or by the doped layer.

17. A semiconductor on insulator (SeOI) wafer, comprising:
a substrate having a doped surface layer, wherein the substrate has three active regions including, one region where an n-channel FET will, be formed, one region where a p-channel FET will be formed and one region where a memory cell array will be formed;
a buried oxide layer arranged only on part but not all of the doped layer; and
a semiconductor layer arranged on the buried oxide layer that is arranged on the part of the doped layer.

18. The SeOI wafer according to claim 17, wherein the substrate and the semiconductor layer includes or is silicon and the doped layer comprises a refractory metal of Co, Ni, Ti, Mo, W or Ta.

19. The SeOI wafer according to claim 17, which further comprises a plurality of regions of buried oxide and semiconductor layers arranged on only parts of the doped layer and a plurality of regions wherein doped surface layer is exposed.

20. A dynamic random-access memory (DRAM) device comprising:
the SeOI wafer according to claim 17;
one or more p-channel or n-channel transistors in the region where the semiconductor layer and the buried oxide layer are provided, with the doped layer providing the back gate for the p-channel and/or n-channel transistors; and
a recessed channel array transistor for a memory cell array in the region of the wafer where no semiconductor layer and buried oxide layer are provided with the doped layer at least partly providing the source and drain regions for the recessed channel array transistor.

21. A method for the manufacture of a semiconductor device, which comprises:
providing a first substrate;
forming a doped layer on a surface region of the first substrate;
providing an oxide layer on the doped layer;
providing a semiconductor layer on the oxide layer to obtain a buried oxide layer and semiconductor-on-insulator (SeOI) wafer;
removing the buried oxide layer and the semiconductor layer from a first region of the SeOI wafer while maintaining the buried oxide layer and the semiconductor layer in a second region of the SeOI wafer; and
providing an upper transistor in the second region by forming a back gate in or by the doped layer; and
providing a lower transistor in the first region by forming source and drain regions in or by the doped layer.

22. The method of claim 21, which further comprises
forming or otherwise providing a p-well and an n-well region of the first region; and
forming or otherwise providing a recessed channel array transistor trench in the first region such that it extends into the p-well region formed below the doped layer in the first region.

23. The method of claim 22, wherein the p-well and n-well region in the first region are formed by implantation.

* * * * *

UNITED STATES PATENT AND TRADEMARK OFFICE
CERTIFICATE OF CORRECTION

PATENT NO. : 8,492,844 B2  
APPLICATION NO. : 13/305206  
DATED : July 23, 2013  
INVENTOR(S) : Enders et al.

Page 1 of 1

It is certified that error appears in the above-identified patent and that said Letters Patent is hereby corrected as shown below:

Title Page:
Item (57) ABSTRACT, line 10, after "SeOI", change "water;" to -- wafer; --.

Signed and Sealed this
Seventeenth Day of September, 2013

Teresa Stanek Rea
*Deputy Director of the United States Patent and Trademark Office*